(12) United States Patent
Xia et al.

(10) Patent No.: US 6,277,200 B2
(45) Date of Patent: Aug. 21, 2001

(54) DIELECTRIC FILM DEPOSITION EMPLOYING A BISTERTIARYBUTYLAMINESILANE PRECURSOR

(75) Inventors: Li-Qun Xia, San Jose; Ellie Yieh, Millbrae, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/728,718

(22) Filed: Nov. 30, 2000

Related U.S. Application Data

(62) Division of application No. 09/322,709, filed on May 28, 1999, now Pat. No. 6,153,261.

(51) Int. Cl.[7] .................................................... C23C 16/00

(52) U.S. Cl. .......................................... 118/697; 118/715

(58) Field of Search .................................... 118/697, 715

(56) References Cited

U.S. PATENT DOCUMENTS

| | | | |
|---|---|---|---|
| 4,822,830 | * | 4/1989 | Adkins .................................. 427/341 |
| 5,492,736 | * | 2/1996 | Laxman .......................... 427/255.37 |
| 5,744,196 | * | 4/1998 | Laxman .......................... 427/255.38 |
| 5,874,368 | * | 2/1999 | Laxman ................................. 427/99 |

OTHER PUBLICATIONS

Laxman et al, Low Temp. LPCVD Silicon Nitride Using Chlorine–Free Organosilicon Precursor, International VLSI Multilevel Interconnection Conf., 1998; 15th p. 568–573.*

* cited by examiner

*Primary Examiner*—Richard Bueker
(74) *Attorney, Agent, or Firm*—Townsend and Townsend and Crew

(57) ABSTRACT

A method and an apparatus for increasing a deposition rate of dielectric films deposited on a substrate for a given temperature while providing the same with good step coverage and gap-fill properties. This is achieved by employing bistertiarybutylaminesilane as a silicon source to react with an oxidizing agent to form a dielectric film on a substrate that includes silicon.

19 Claims, 7 Drawing Sheets

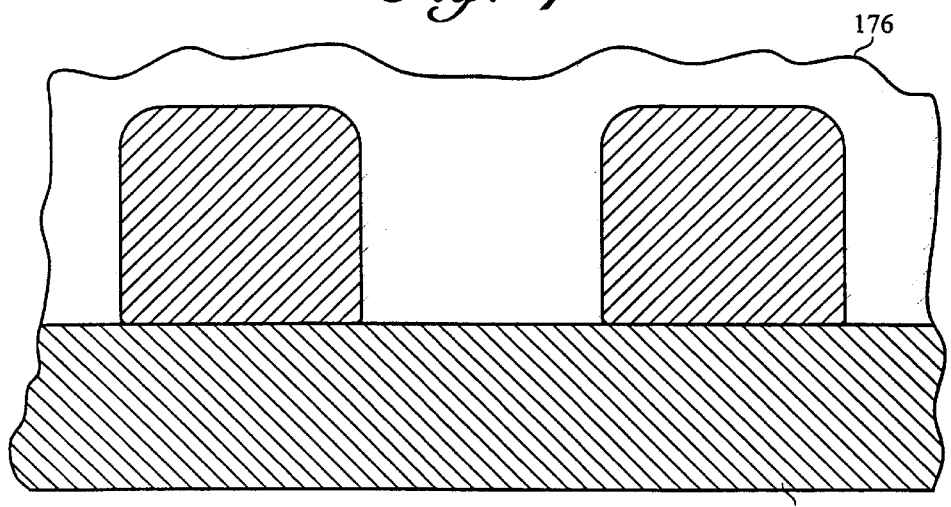

FLOW INTO THE PROCESS CHAMBER A PROCESS GAS INCLUDING BTBAS, A NITROGEN SOURCE AND AN OXYGEN SOURCE — 178

SET PRESSURE TO A PREDETERMINED LEVEL — 180

SET TEMPERTURE TO A PREDETERMINED LEVEL — 182

MAINTAIN PROCESS CONDITIONS SUITABLE FOR DEPOSITING A DIELECTRIC LAYER — 184

FLOW INTO THE PROCESS CHAMBER A PROCESS GAS INCLUDING BTBAS, A FIRST NITROGEN SOURCE AND A SECOND NITROGEN SOURCE — 278

SET PRESSURE TO A PREDETERMINED LEVEL — 280

SET TEMPERTURE TO A PREDETERMINED LEVEL — 282

MAINTAIN PROCESS CONDITIONS SUITABLE FOR DEPOSITING A DIELECTRIC LAYER — 284

Fig. 9

DIELECTRIC FILM DEPOSITION EMPLOYING A BISTERTIARYBUTYLAMINESILANE PRECURSOR

This application is a division of and claims the benefit of U.S. application Ser. No. 09/322,709, filed May 28, 1999, the disclosure of which is incorporated by reference. Now U.S. Pat. No. 6,153,261.

BACKGROUND OF THE INVENTION

The present invention relates to the fabrication of integrated circuits. More particularly, the invention provides a technique, including a method and an apparatus, for increasing the deposition rate of dielectric films, at a given temperature, while demonstrating good gap filling properties comparable with existing film deposition techniques.

Deposition of dielectric films, such as silicon dioxide ($SiO_2$), silicon nitride (SiN), silicon oxynitride (SiON) and the like, over a semiconductor substrate is a common step in the formation of some integrated circuit (IC) structures. For example, dielectric films may be used to form gates of field effect transistors (FETs), spacers separating adjacent FETs, or sacrificial layers in the formation of dynamic random access memories. These films are typically deposited employing chemical vapor deposition (CVD) techniques.

Particularly suitable as an inter-level dielectric, $SiO_2$ films may be formed by using silane, $SiH_4$, as a silicon source and molecular oxygen, $O_2$, as an oxygen source, forming on a substrate according to the following reaction:

$$SiH_4 + O_2 \rightarrow SiO_2 \qquad (1)$$

Historically, silane has provided adequate silicon dioxide inter-level dielectric films at varying chamber pressures and substrate temperatures. However, advances in integrated circuit technology have led to a scaling down of device dimensions and an increase in chip size and complexity. This has necessitated improved methods for deposition of dielectric films with enhanced gap filling properties. As a result, tetraethylorthosilicate, $Si(OC_2H_5)_4$, [hereinafter referred to as TEOS] as a silicon source has gained wide acceptance due to its superior gap-filling properties.

TEOS reacts with molecular oxygen, $O_2$, as an oxygen source to form $SiO_2$ on a substrate according to the following reaction:

$$Si(OC_2H_5)_4 + O_2 \rightarrow SiO_2 + \text{by products} \qquad (2)$$

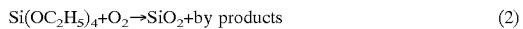

Originally, TEOS had limited use as an inter-level dielectric film, because of the high substrate temperature required to deposit the same efficiently. Reaction (2) required a temperature of approximately 700° C. in order to achieve an acceptable deposition rate. The aforementioned temperature is incompatible with aluminum metallization. As a result, there has been a constant endeavor to lower the deposition temperature of inter-level dielectric films formed using TEOS as a silicon source.

One employs a plasma in the chamber for plasma enhanced chemical vapor deposition (PECVD) apparatus. Another such effort replaces molecular oxygen with ozone, $O_3$, to produce a silicon dioxide film according to the following reaction:

$$Si(OC_2H_5)_4 + O_3 \rightarrow SiO_2 + \text{by-products} \qquad (3)$$

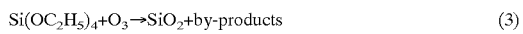

With this reaction, silicon dioxide films may be deposited at temperatures as low as 400° C. while still providing an acceptable deposition rate.

Another composition of dielectric films employs nitrogen sources to form silicon nitride films on a substrate. The silicon nitride films are amorphous insulating materials that are typically used as a final passivation layer for integrated circuits, as a mask for selective oxidation of silicon, and as a gate dielectric material for MNOS devices.

An early composition of a silicon nitride film, $Si_3N_4$ is deposited using low pressure chemical vapor deposition (LPCVD) techniques according to the following reaction:

$$SiH_2Cl_2 + NH_3 \rightarrow Si_3N_4 \qquad (4)$$

Similar to reaction (2), reaction (4) had limited use, because of the high substrate temperature required to deposit the same efficiently. In order to achieve an acceptable deposition rate, reaction (4) requires a temperature of approximately 800° C., which is incompatible with many post deposition processes. To further reduce the deposition temperature of silicon nitride films, the following PECVD reactions has been developed:

$$SiH_4 + NH_3 + N_2 \rightarrow SiN(H) \qquad (5)$$

$$SiH_4 + NH_3 + N_2O \rightarrow SiON \qquad (6)$$

Both reactions (5) and (6) may be deposited at a process temperature as low as 200° C. while still providing an acceptable deposition rate.

What is needed, therefore, is a technique for improving the deposition rate of dielectric films without increasing the deposition temperature of the same.

SUMMARY OF THE INVENTION

The present invention provides a method and an apparatus for increasing a deposition rate of dielectric films deposited on a substrate at a given temperature while providing good step coverage and gap-fill properties. The method does so by employing bistertiarybutylaminesilane [hereinafter referred to as BTBAS] as a silicon source to react with a reducing agent to form a dielectric film, which includes silicon, on a substrate. Use of BTBAS allows depositing either a silicon oxide or silicon nitride film at an accelerated rate while demonstrating superior uniformity and step coverage and reducing the presence of gaps. This results from, among other things, the relatively high chamber pressures that may be achieved using BTBAS as a silicon source.

The method of the present invention includes placing a substrate in a deposition zone, flowing, into the deposition zone of a process chamber, a process gas including bistertiarybutylaminesilane (BTBAS) and a nitrogen source. The process chamber is pressurized to a predetermined pressure level and the substrate is heated to a predetermined temperature. Thereafter, the deposition zone is maintained at process conditions suitable for depositing a silicon-containing dielectric film on the substrate. The nitrogen source may be ammonia, $NH_3$, molecular nitrogen, $N_2$, or both. If both $NH_3$ and molecular nitrogen, $N_2$, are present in the process gas, a silicon nitride, SiN, dielectric film is deposited on the substrate at a rate of 50 angstroms/minute with a uniformity of 14%. In the absence of $NH_3$, an oxygen source is included in the process gas that may be ozone, $O_3$, but preferably is molecular oxygen, $O_2$. In this fashion, a silicon oxide, such as silicon dioxide, $SiO_2$, dielectric film is deposited on the substrate at a rate of approximately 1,800 angstroms/minute with a uniformity of 14%. To practice the aforementioned methods, a substrate processing system is provided that includes a housing defining a process chamber; a substrate moving system for moving the substrate into the process chamber and positioning the substrate on the substrate holder; a gas delivery system for introducing a process gas into the process chamber to deposit a layer over the substrate, a temperature control system for maintaining a selected temperature within the process chamber; a pressure control system for maintaining a selected pressure within the vacuum system; a controller for controlling the gas delivery system, the temperature control system; and the pressure control system, and a memory data communication with the controller containing a computer program, to be operated on by the controller, for practicing the aforementioned methods.

These and other embodiments of the present invention, as well as their advantages and features, are described in more detail in conjunction with the text below and attached figures.

BRIEF DESCRIPTION OF THE DRAWINGS

FIG. 7 is a process flow chart illustrating the steps of a preferred embodiment of the present invention;

FIG. 8 is a cross-sectional view of the integrated circuit shown above in FIG. 6 with a dielectric layer disposed thereon in accord with the present invention;

FIG. 9 is a flow chart illustrating the steps of an alternate embodiment of the present invention.

DESCRIPTION OF THE SPECIFIC EMBODIMENTS

I. Exemplary CVD System

Figure 1:
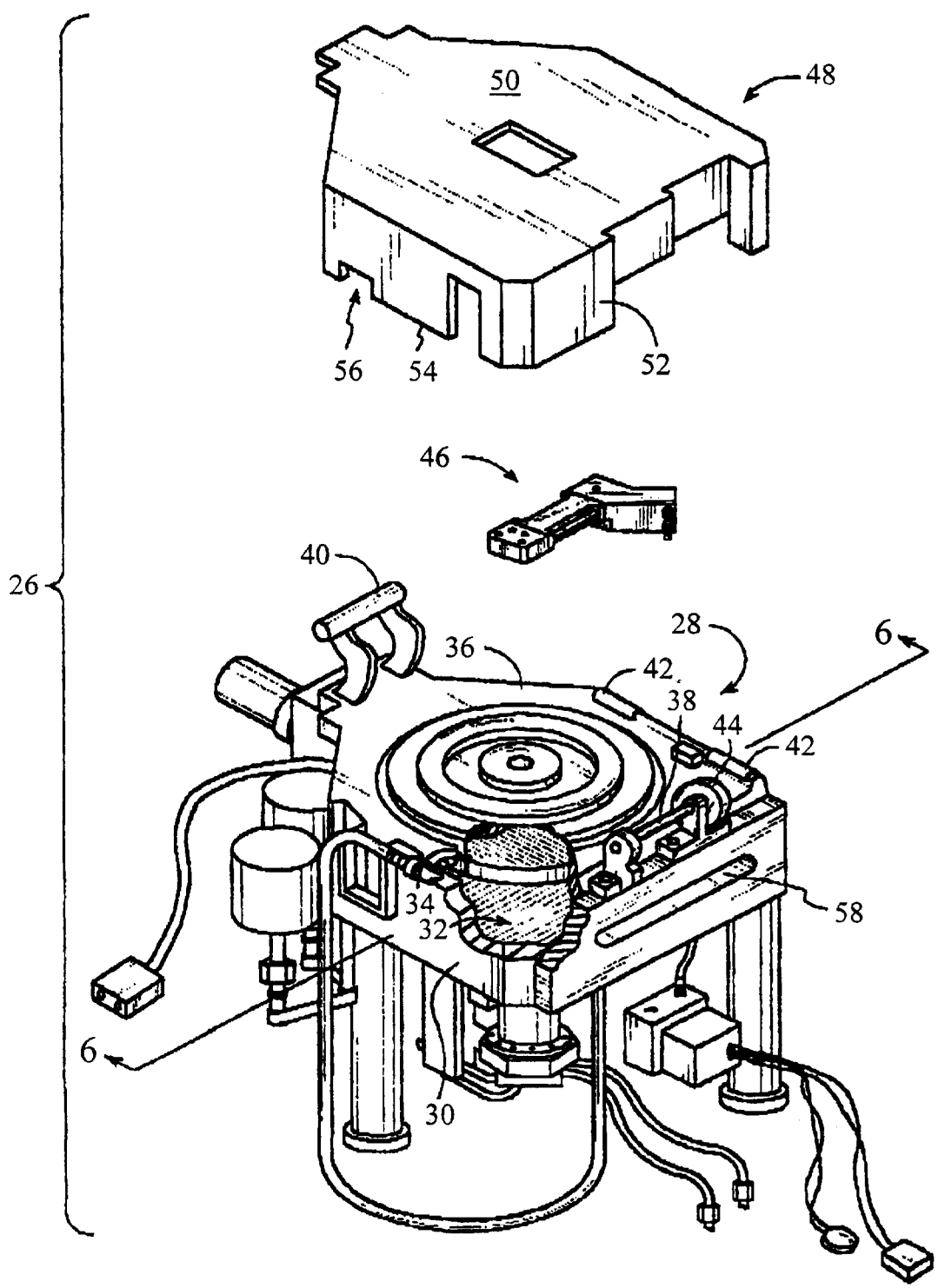
FIG. 1 is vertical view of one embodiment of a chemical vapor deposition (CVD) apparatus according to the present invention.

Referring to FIG. 1, a suitable chemical vapor deposition (CVD) apparatus 26 in which the method of the present invention can be carried out is shown as including an enclosure assembly 28 formed from a process-compatible material, such as aluminum or anodized aluminum. The enclosure assembly 28 includes a housing 30, defining a process chamber 32 with an opening 34, and a vacuum lid 36. The vacuum lid 36 is pivotally coupled to the housing 30 via a hinge 38 to selectively cover the opening 34. A handle 40 is attached to the vacuum lid 36, opposite to the hinge 38. The handle 40 facilitates moving the vacuum lid 36 between opened and closed positions. In the opened position, the opening 34 is exposed, allowing access to the process chamber 32. In the closed position, the vacuum lid 36 covers the opening 34, forming a fluid-tight seal therewith. To that end, lid clamps 42 may be employed to resiliently bias the vacuum lid 36 against the housing 30. The hinge 38, however, includes a locking ratchet mechanism 44 to prevent the vacuum lid 36 from unintentionally moving into the closed position.

A gas distribution assembly 46 is typically attached to the vacuum lid 36. The gas distribution assembly 46 delivers reactive and carrier gasses into the process chamber 32, discussed more fully below. A cover 48 is in superimposition with the vacuum lid 36 and adapted to enshroud the gas distribution assembly 46. To that end, the cover 48 includes a cover portion 50 lying in a plane that extends parallel to a plane in which the vacuum lid 36 lies. A sidewall 52 extends from the cover portion 50, terminating in a periphery 54. The contour of the periphery 54 typically matches the contour of the components of the apparatus 26 disposed on the vacuum lid 36. For example, the periphery 54 may include recessed portions 56 that are positioned to receive one of the lid clamps 42 when the cover 48 is seated against the vacuum lid 36. To facilitate access to the process chamber 32, without compromising the fluid-tight seal between the vacuum lid 36 and the housing 30, a slit valve opening 58 is present in the housing 30, as well as a vacuum lock door (not shown). The slit valve opening 58 allows transfer of a wafer (not shown) between the process chamber 32 and the exterior of the apparatus 26. The aforementioned transfer may be achieved by any conventional wafer transfer assembly (not shown). An example of a conventional robotic wafer transfer assembly is described in commonly assigned U.S. Pat. No. 4,951,601 to Maydan, the complete disclosure of which is incorporated herein by reference.

Figure 2:
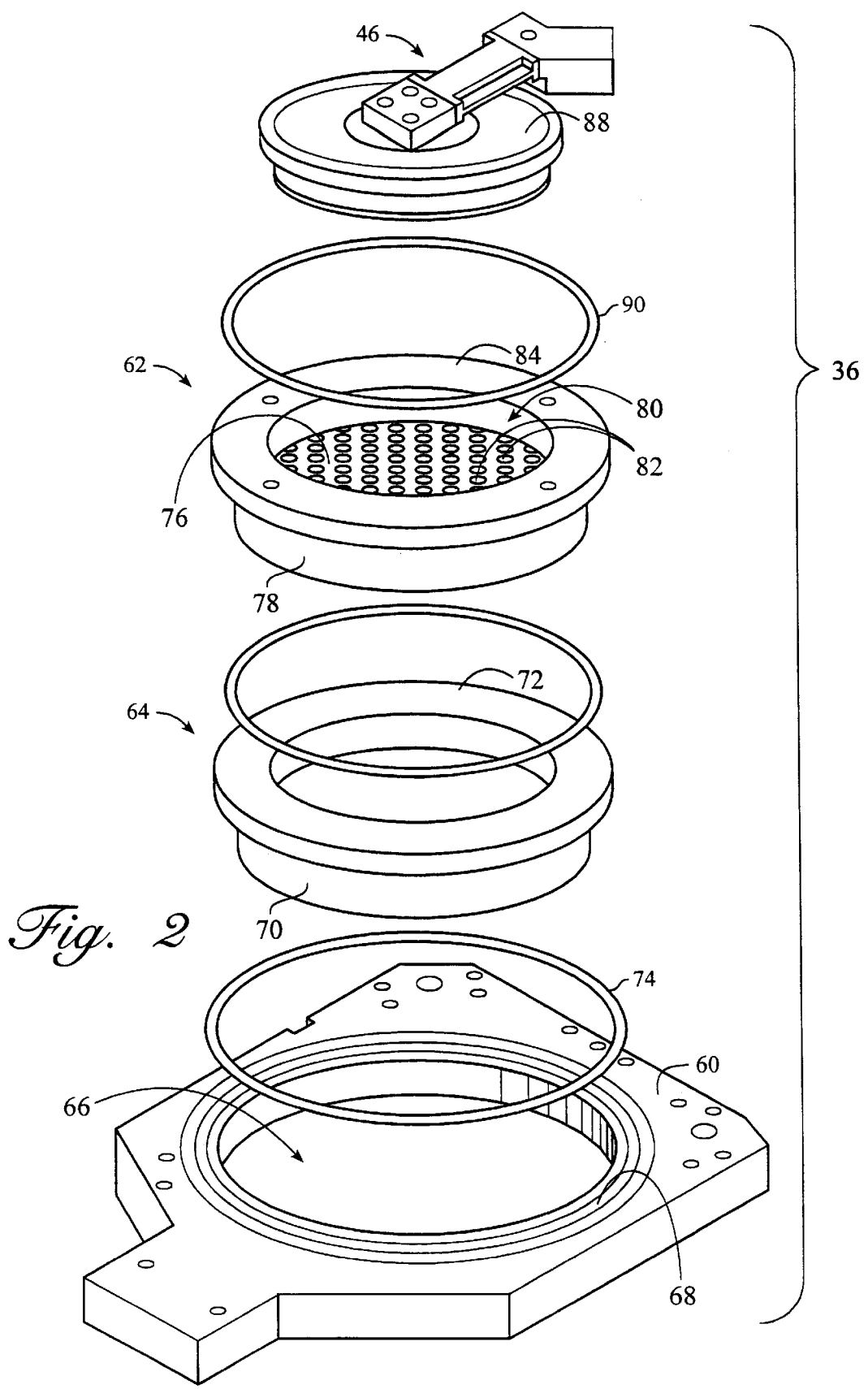
FIG. 2 is an exploded perspective view of a lid employed on the CVD apparatus shown in FIG. 1.

Referring to FIG. 2, the vacuum lid 36 includes a base plate 60, a gas distribution plate 62 and a sleeve 64. The base plate 60 has a centrally disposed aperture 66 and a recessed periphery 68 surrounding the aperture 66. The sleeve 64 has a shape complementary to the shape of the aperture 66 so as to fit therein. Typically, the sleeve 64 includes a cylindrical wall 70, which fits into the aperture 66, with a circular flange 72 extending from one end. The circular flange 72 seats against the recessed periphery 68 when the sleeve 64 is placed in a final seating position. To maintain fluid-tight integrity between the sleeve 64 and the base plate 60, a sealing member 74, such as gasket, is positioned between the recessed periphery 68 and the circular flange 72. The gas distribution plate 62 includes a circular base surface 76 and an annular side surface 78 extending from, and transversely to, the base surface 76, terminating in opening 80. A plurality of apertures 82 are formed in the circular base surface 76. An annular flange 84 extends from the opening 80 and transversely to the annular side surface 78 and seats against the circular flange 72 of the sleeve 64 when placed in a final seating position. In the final seating position, both the circular base surface 76 and the annular side surface 78 are encircled by the sleeve 64. A gasket 86 is positioned between the circular flange 72 and the annular flange 84 to ensure that there is a fluid-tight seal between them. The gas distribution assembly 46 includes a lid portion 88 that fits over the opening 80 and rests against the annular flange 84. A gasket 90 is disposed between the cover portion 88 and the annular flange 84 to form a fluid-tight seal between them.

Figure 3:
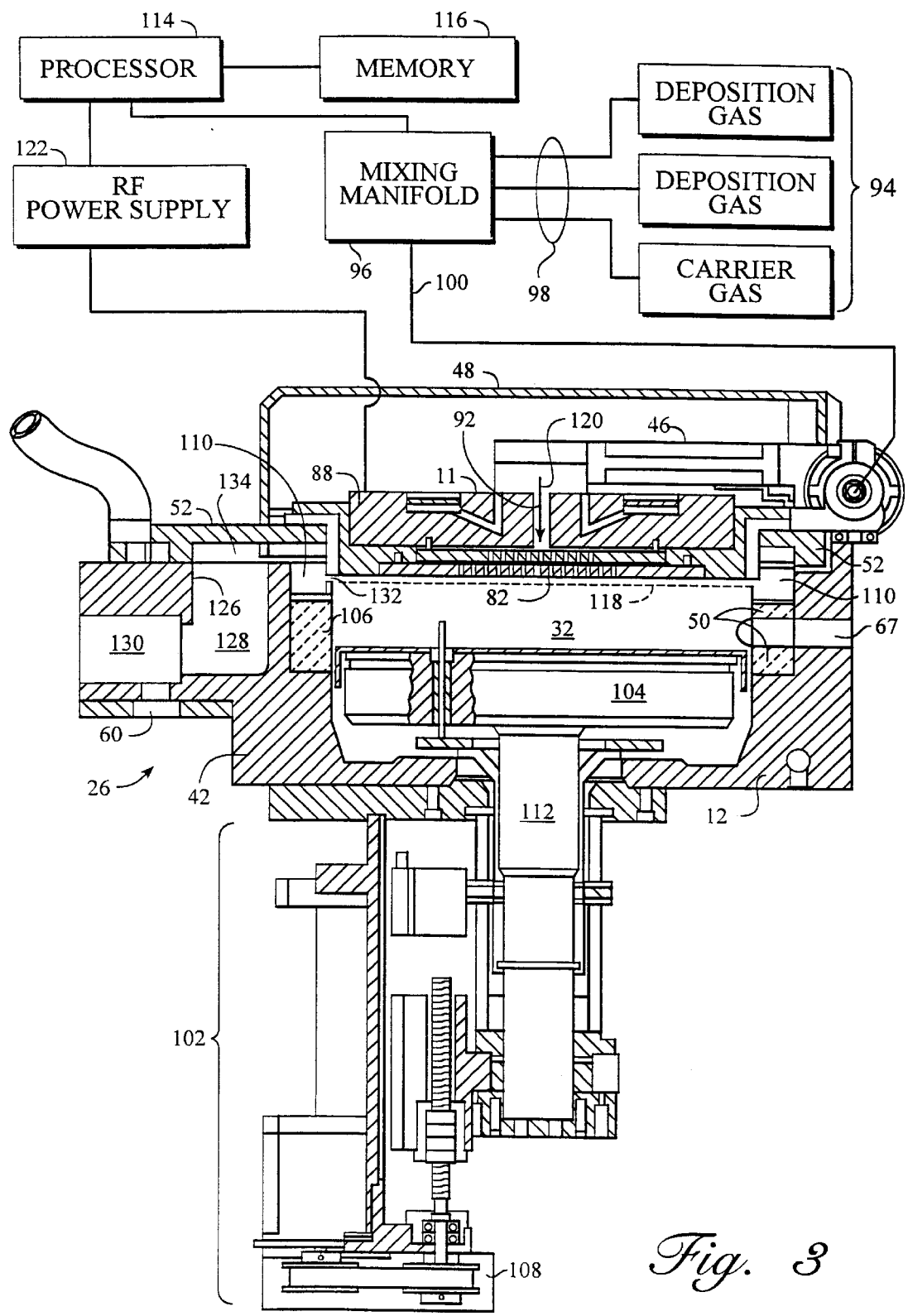
FIG. 3 is a cross-sectional view of the CVD apparatus shown above in FIG. 1.

Referring to FIGS. 2 and 3, the gas distribution assembly 46 is attached to the lid portion 88 in any conventional manner, e.g., by bolting, brazing or the like. The lid portion 88 includes a throughway 92 to place the gas distribution assembly 46 in fluid communication with the process chamber 32. A supply 94 of deposition and carrier gases is in fluid communication with the gas distribution assembly 46 via a mixing manifold 96. Specifically, a plurality of supply lines 98 are coupled between the supply 94 and the mixing manifold 96. The carrier and deposition gases may be intermingled in the mixing manifold 96 before flowing into the gas distribution assembly 46 via conduit 100. Typically, the supply line for each supply of gas includes (i) several safety shut-off valves (not shown) that may be employed to terminate gas flow into the process chamber 32 either manually or automatically. Additionally, mass flow controllers (also not shown) may be employed to measure the flow of gas through each of the supply lines 98. This structure is particularly useful if the supply 94 includes a quantity of toxic gases.

Disposed within the process chamber 32 is a heater/lift assembly 102 coupled to a pedestal 104, and a process chamber liner 106. The pedestal 104 is positioned between the heater/lift assembly 102 and the vacuum lid 36 when the vacuum lid 36 is in the closed position. The heater/lift assembly 102 is operably connected to a motor 108 to be moved controllably so as to vary the distance between the pedestal 104 and the vacuum lid 36. Information concerning the position of the pedestal 104 within the process chamber 32 is provided by a sensor (not shown). The process chamber liner 106 surrounds the pedestal 104 and defines a lower portion of an annular flow channel 110, with the upper portion of the annular flow channel 110 being defined by the vacuum lid 36. The pedestal 104 also includes resistively heated components, such as an embedded single-loop heater element (not shown) configured to make two full turns in the form of parallel concentric circles. An outer portion (not shown) of the heater element runs adjacent to a perimeter of the pedestal 104, while an inner portion runs on the path of a concentric circle having a smaller radius. The wiring to the heater element passes through the stem 112 of the heater/lift assembly 102.

Typically, any or all of the process chamber liner 106, gas dispersion plate 62 and various other apparatus 26 hardware are made out of material such as aluminum, anodized aluminum, or ceramic. An example of such a CVD apparatus is described in U.S. Pat. No. 5,558,717 entitled "CVD Processing Chamber," issued to Zhao et al. The U.S. Pat. No. 5,558,717 is assigned to Applied Materials, Inc., the assignee of the present invention, and is hereby incorporated by reference in its entirety. The pedestal 104 may be formed from any process-compatible material, including, aluminum, anodized aluminum, aluminum nitride, or aluminum oxide ($Al_2O_3$ or alumina).

A processor 114 is in electrical communication with the apparatus 26 to regulate the operations thereof. Typically, the processor 114 is part of a single-board computer (SBC) that includes analog and digital input/output boards, interface boards and stepper motor controller boards. Various components of the CVD apparatus 26 conform to the Versa Modular European (VME) standard, which defines board and card cage, as well as connector type and dimensions. The VME standard also defines the bus structure as having a 16-bit data bus and a 24-bit address bus. Functioning as a controller, the processor 114 executes system control software, which is a computer program stored in a memory 116, electronically coupled to processor 114. Any type of memory device may be employed, such as a hard disk drive, a floppy disk drive, a card rack or a combination thereof. The processor 114 operates under the control of the system control software, which includes sets of instructions that dictate the timing, mixture of gases, process chamber pressure, process chamber temperature, microwave power levels, pedestal position and other parameters of a particular process, discussed more fully below with respect to FIG. 5.

Referring again to FIGS. 2 and 3, during a deposition procedure, the vacuum lid 36 is placed in the closed position. The heater/lift assembly 102 places the support pedestal 104 in a processing position 118 disposed proximate to the vacuum lid 36. When placed in the processing position 118, the pedestal 104 is surrounded by the process chamber liner 106 and the annular flow channel 110. In this fashion, the pedestal 104 is located proximate to the gas distribution plate 62. Deposition and carrier gases are supplied via the supply lines 98 into the gas mixing manifold 96. The gas mixing manifold 96 causes the aforementioned gases to intermingle, forming the process gas, the path of which is shown as arrow 120. Specifically, the process gas flows through the conduit 100, into the gas distribution assembly 46, and through the apertures 82 in the gas dispersion plate 62. In this fashion, the process gas travels into the process chamber 32 and is vented toward the pedestal 104, where a wafer (not shown) would be positioned and is uniformly radially distributed across the wafer in a laminar flow.

The deposition process performed in CVD apparatus 26 is a thermal process in which the process gas mixture reacts thermally to deposit the desired films on the surface of a semiconductor wafer (not shown) supported on pedestal 104. Typically, the pedestal 104 is resistively heated to provide thermal energy for the reaction. During the deposition process it is beneficial to reduce the condensation of the process gases. To that end, a hot liquid is circulated through the walls 126 of the process chamber 32 to maintain the process chamber 32 at an elevated temperature. Fluids used to heat the process chamber walls 126 include the typical fluid types, i.e., water-based ethylene glycol or oil-based thermal transfer fluids. The aforementioned heating reduces the accumulation of volatile reactants in the process chamber 32 by reducing the condensation of the process gas on the walls 126 and in the aforementioned passages.

The portion of the process gas that is not deposited, or does not condense, is evacuated from the process chamber 32 by a vacuum pump (not shown). Specifically, the gases are exhausted through an annular slot 132 surrounding the processing position 118, and then into the annular flow channel 110. The annular slot 132 and the annular flow channel 110 are defined by the gap between vacuum lid 36 and chamber liner 126. Both the annular slot 132 and the annular flow channel 110 have circular symmetry to provide uniform flow of process gases over the pedestal 104 so as to deposit a uniform film on the wafer (not shown).

From the annular flow channel 110, the gases flow through a lateral flow channel 134 in fluid communication therewith, past a viewing port (not shown), through an exhaust passageway 128, past a vacuum shut-off valve 130, and into an exhaust outlet 136 that connects to the external vacuum pump (not shown).

Figure 4:
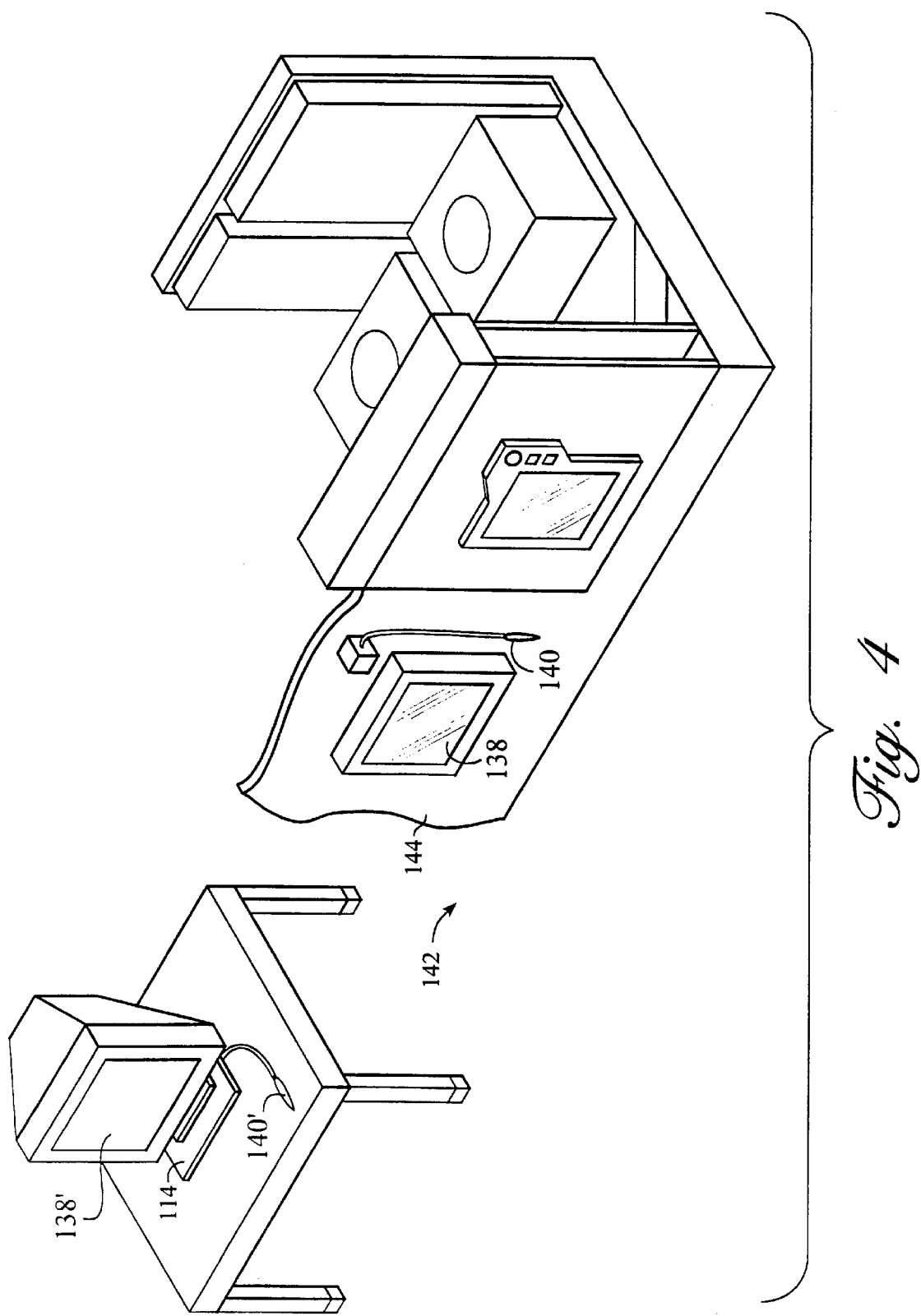
FIG. 4 is a simplified diagram of a system monitor and a multi-chamber system employing one or more of the CVD apparatuses shown above in FIG. 1.

The interface between a user and the processor 114 is via a CRT monitor 138 and light pen 140, shown in FIG. 4, which is a simplified diagram of the CRT monitor and CVD apparatus 26 in a substrate processing system 142, which may include one or more process chambers. In the preferred embodiment two monitors 138 and 138' are used, one mounted in a clean room wall 144 for the operators and the other behind the wall for the service technicians. The CRT monitors 138 and 138' simultaneously display the same information, but only one light pen 140 is enabled for data input during any given time. A light sensor (not shown) in the tip of light pen 140 detects light emitted by the CRT monitor 138. To select a particular screen or function, the operator touches a designated area of the CRT monitor 138 and pushes a button (not shown) on the light pen 140. The touched area provides a visual response, such as a change in color, or a new menu or screen being displayed, confirming communication between the light pen 140 and the CRT monitor 138. Other input devices, such as a keyboard, mouse, or other pointing or communication device, may be used instead of or in addition to the light pen 140 to allow the user to communicate with the processor 114.

The process for depositing the film can be implemented using a computer program product that is executed by the processor 114. The computer program code can be written in any conventional computer-readable programming language: for example, 68000 assembly language, C, C++, Pascal, Fortran or others. Suitable program code is entered into a single file or multiple files using a conventional text editor and is stored or embodied in a computer-usable medium, such as the memory 116, shown in FIG. 3. If the entered code text is in a high level language, the code is compiled, and the resultant compiler code is then linked with an object code of precompiled Windows library routines. To execute the linked compiled object code, the system user invokes the object code, causing the processor 114 to load the code in the memory 116. The processor 114 then reads and executes the code to perform the tasks identified in the program.

Figure 5:
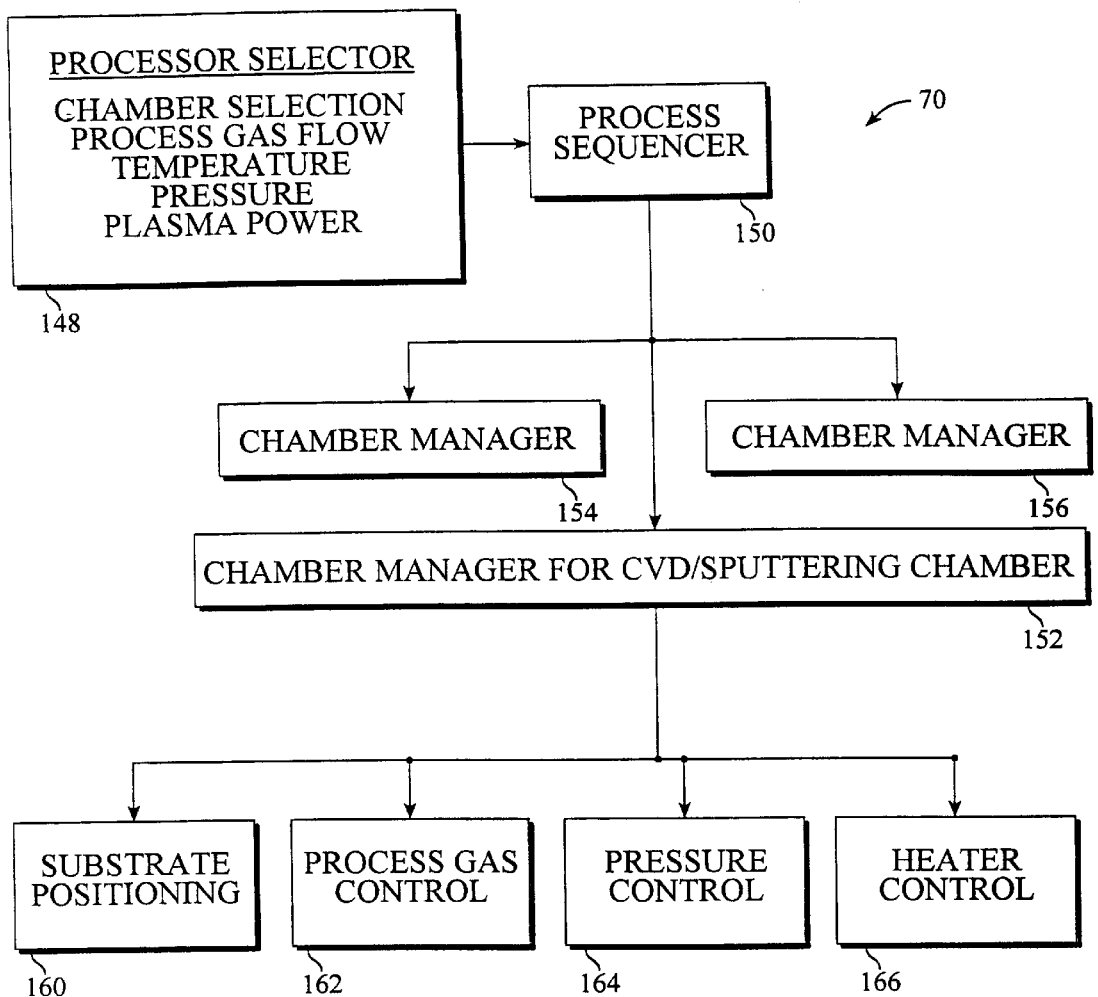
FIG. 5 is an illustrative block diagram of the hierarchical control structure of the system control software employed to control the operation of the CVD apparatus shown in FIG. 1.

Referring to both FIGS. 4 and 5, shown is an illustrative block diagram of the hierarchical control structure of the system control software, computer program 146, according to a specific embodiment. Using the light pen 140, a user enters a process set number and process chamber number into a process selector subroutine 148 in response to menus or screens displayed on the CRT monitor 138. The process sets are predetermined sets of parameters necessary to carry out specified processes and are identified by predefined set numbers. The process selector subroutine 148 identifies (i) the desired apparatus 26 and (ii) the desired set of process parameters needed to operate the process chamber for performing a selected process. The process parameters relate to specific process conditions, for example, process gas composition and flow rates, temperature, pressure, plasma conditions such as RF power levels and the low-frequency RF frequency, cooling gas pressure, and process chamber wall temperature. These parameters are provided to the user in the form of a recipe and are entered utilizing the light pen/CRT monitor interface. The signals for monitoring the process are provided by the analog and digital input boards of the system controller, and the signals for controlling the process are output on the analog and digital output boards of CVD apparatus.

A process sequencer subroutine 150 comprises program code for accepting the identified process chamber and set of process parameters from the process selector subroutine 148 and for controlling operation of the various process chambers. Multiple users can enter process set numbers and process chamber numbers, or a user can enter multiple process set numbers and process chamber numbers, and the sequencer subroutine 150 schedules the selected processes in the desired sequence. Preferably, sequencer subroutine 150 includes a program code to perform the steps of (i) monitoring the operation of the process chambers to determine if the process chambers are being used, (ii) determining what processes are being carried out in the process chambers being used, and (iii) executing the desired process based on the availability of a process chamber and the type of process to be carried out. Conventional methods of monitoring the process chambers can be used, such as polling. When scheduling which process is to be executed, sequencer subroutine 150 takes into consideration the present condition of the process chamber being used in comparison with the desired process conditions for a selected process, or the "age" of each particular user-entered request, or any other relevant factor a system programmer desires to include for determining scheduling priorities.

Once sequencer subroutine 150 determines which process chamber and process set combination are going to be executed next, sequencer subroutine 150 initiates execution of the process set by passing the particular process set parameters to process chamber manager subroutines 152, 154 and 156, which control multiple processing tasks in the process chamber 32 according to the process set determined by the sequencer subroutine 150. For example, the process chamber manager subroutine 152 comprises program code for controlling the CVD process operations in the process chamber 32. The process chamber manager subroutines 152, 154 and 156 also control execution of various process chamber component subroutines that control operation of the process chamber components necessary to carry out the selected process set. Examples of process chamber component subroutines are substrate positioning subroutine 160, process gas control subroutine 162, pressure control subroutine 164 and heater control subroutine 166. Those having ordinary skill in the art will readily recognize that other process chamber control subroutines can be included depending on which processes are to be performed in the process chamber 32. In operation, the process chamber manager subroutine 152 selectively schedules or calls the process component subroutines in accordance with the particular process set being executed. The process chamber manager subroutine 152 schedules the process component subroutines much like the sequencer subroutine 150 schedules which process chamber 32 and process set are to be executed next. Typically, the process chamber manager subroutine 152 includes steps of (i) monitoring the various process chamber components, (ii) determining which components need to be operated based on the process parameters for the process set to be executed, and (iii) causing execution of a process chamber component subroutine responsive to the monitoring and determining steps.

Referring to both FIGS. 3 and 5, the substrate positioning subroutine 160 comprises program code for controlling process chamber components that are used to load the substrate (not shown) onto the pedestal 104 and, optionally, to lift a substrate (not shown), disposed thereon, to a desired height in the process chamber 32 to control the spacing between the substrate (not shown) and the gas distribution plate 62. When the substrate (not shown) is loaded into the process chamber 32, the pedestal 104 is lowered to receive the substrate, and thereafter, the pedestal 104 is raised to the desired height in the process chamber 32 to maintain the substrate (not shown) at a first distance or spacing from the gas distribution plate 62 during the CVD process. In operation, the substrate positioning subroutine 160 controls the movement of the pedestal 104 in response to process set parameters related to the support height that are transferred from the process chamber manager subroutine 152.

The process gas control subroutine 162 has program code for controlling process gas composition and flow rates. The process gas control subroutine 162 controls the open/close position of the safety shut-off valves (not shown), and also ramps up/down the mass flow controllers to obtain the desired gas flow rate. The process gas control subroutine 162 is invoked by the process chamber manager subroutine 152, as are all process chamber component subroutines, and receives from the process chamber manager subroutine process parameters related to the desired gas flow rates from that subroutine. Typically, the process gas control subroutine 162 operates by opening the gas supply lines and performing repeatedly (i) reading the necessary mass flow controllers, (ii) comparing the readings to the desired flow rates received from the process chamber manager subroutine 152, and (iii) adjusting the flow rates of the gas supply lines as necessary. Furthermore, the process gas control subroutine 162 includes steps for monitoring the gas flow rates for unsafe rates and for activating the safety shut-off valves when an unsafe condition is detected.

In some processes, an inert gas such as helium or argon is flowed into the process chamber 32 to stabilize the pressure in the process chamber before reactive process gases are introduced. For these processes, the process gas control subroutine 162 is programmed to include steps for flowing the inert gas into the process chamber 32 for an amount of time necessary to stabilize the pressure in the process chamber, and then the steps described above are carried out. Additionally, when a process gas is to be vaporized from a liquid precursor, for example, BTBAS, the process gas control subroutine 162 is written to include steps for injecting a delivery gas, such as helium, through the liquid precursor in a liquid vaporizer-feeder, commonly referred to as a precision liquid injection system, one of which is described in U.S. Pat. No. 5,272,880, which is incorporated by reference herein. As discussed above, the desired process gas flow rates are transferred to the process gas control subroutine 162 as process parameters. Furthermore, the process gas control subroutine 162 includes steps for controlling the operation of the aforementioned precision liquid injection system.

The pressure control subroutine 162 comprises program code for controlling the pressure in the process chamber 32 by regulating the size of the opening of the throttle valve in the exhaust system of the process chamber. The size of the opening of the throttle valve is set to control the process chamber pressure, at the desired level, in relation to the total process gas flow, the size of the process chamber, and the pumping set-point pressure for the exhaust system. When the pressure control subroutine 164 is invoked, the desired or target pressure level is received as a parameter from the process chamber manager subroutine 152. The pressure control subroutine 164 measures the pressure in the process chamber 32 by reading one or more conventional pressure manometers connected to the process chamber and to compares the measured value(s) with the target pressure to obtain PID (proportional, integral, and differential) values from a stored pressure table corresponding to the target pressure, and to adjust the throttle valve according to the PID values obtained from the pressure table. Alternatively, the pressure control subroutine 164 can be written to open or close the throttle valve to a particular aperture size to regulate the process chamber 32 to the desired pressure.

The heater control subroutine 166 comprises program code for controlling the current to a heating unit that is used to heat the pedestal 104 and therefore, a substrate (not shown) disposed on the pedestal 104. The heater control subroutine 166 is also invoked by the process chamber manager subroutine 152 and receives a target or set-point temperature parameter. The heater control subroutine 166 measures the temperature by measuring voltage output of a thermocouple located in the pedestal 104, comparing the measured temperature with the set-point temperature, and increasing or decreasing the current applied to the heating unit to obtain the set-point temperature. The temperature is obtained from the measured voltage by looking up the corresponding temperature in a stored conversion table or by calculating the temperature using a fourth-order polynomial.

When an embedded loop is used to heat the pedestal 104, the heater control subroutine 166 gradually controls a ramp up/down of current applied to the loop. Additionally, a built-in fail-safe mode can be included to detect process safety compliance, and can shut down operation of the heating unit if the process chamber 32 is not properly set up.

A plasma control subroutine (not shown) may be included to set the low and high frequency RF power levels applied to process electrodes in the process chamber 32. In this fashion, a plasma cleaning procedure may be employed to remove residue from the interior surfaces of the process chamber 32. Similarly to the previously described process chamber component subroutines, the plasma control subroutine is invoked by the process chamber manager subroutine 152.

The above description is mainly for illustrative purposes, and variations of the above-described system may be employed. For example, the wafer could be supported by a pedestal and heated by quartz lamps. The layer and method for forming such a layer of the present invention is not limited to any specific apparatus.

II. Formation of Dielectric Film Employing BTBAS

Figure 6:
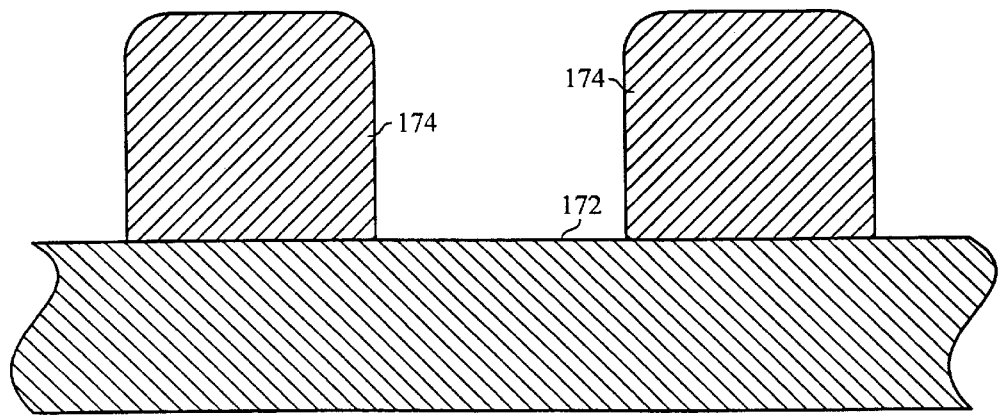
FIG. 6 is a cross-sectional view of a portion of an integrated circuit on which a dielectric layer is deposited in accordance with the present invention.

The method of the present invention may be employed to deposit improved dielectric films, such as a silicon oxide film or a silicon nitride film, in the exemplary CVD apparatus 26 described above with respect to FIG. 3. Initially, a substrate 172, shown in FIG. 6, rests on the pedestal 104 and is moved to a deposition zone located proximate to the processing position 118, shown in FIG. 3. Although the substrate 172, shown in FIG. 6, may have virtually any topography, the substrate 172 typically includes patterned features 174 that may be formed of aluminum, tungsten or some other conductor. A dielectric layer (not shown) is disposed atop the patterned features 174 by use of the method discussed below with respect to FIG. 7.

Referring to FIG. 7, at step 178 a process gas including BTBAS, a nitrogen source and an oxygen source is flowed into the process chamber. The nitrogen source is molecular nitrogen, $N_2$, flowed into the process chamber at a rate of 500 to 2,500 standard cubic centimeters per second (sccm), inclusive, but preferably at 2,000 sccm. The oxygen source may be ozone, $O_3$, but preferably is molecular oxygen, $O_2$, flowed into the process chamber at a rate of 1,000 to 3,000 sccm. The BTBAS is flowed into the process chamber at a rate in the range of 400 to 1200 milligrams per minute (mgm), inclusive, with 600 mgm being preferred. At step 180, the process chamber is pressurized to a predetermined pressure level in the range of 1 Torr to 760 Torr, inclusive, but preferably 10 Torr. At step 182, the substrate temperature is set to a predetermined temperature in the range of 500° to 650° C., inclusive, but preferably 600° C. Thereafter, at step 184, the deposition zone is maintained at process conditions suitable for depositing a silicon-containing dielectric film on the substrate. By use of the aforementioned method, a silicon oxide dielectric film 176 is deposited at a rate of approximately 1,800 angstroms/minute with a uniformity of 14%. The relatively high chamber pressures that may be achieved using BTBAS as a silicon source provide superior step coverage while reducing the presence of gaps as shown in FIG. 8.

Referring to FIGS. 8 and 9, another embodiment replaces the oxygen source with an additional nitrogen source, such as ammonia, $NH_3$, to facilitate deposition of a silicon nitride dielectric film at step 278. In this method, molecular nitrogen, $N_2$, is flowed into the process chamber at a rate of 500 to 2,500 standard cubic centimeters per second (sccm), inclusive, but preferably at 2,000 sccm. Ammonia is flowed into the process chamber at a rate in the range of 100 to 300 sccm, inclusive, with 200 sccm being preferred. The BTBAS is flowed into the process chamber at a rate in the range of 400 to 1200 milligrams per minute (mgm), inclusive, with of 800 mgm being preferred. At step 280, the process chamber is pressurized to a predetermined pressure level in the range of 1 Torr to 760 Torr, with 600 Torr being preferred. At step 282, the substrate temperature is set to a predetermined temperature in the range of 500° to 650° C., inclusive, but preferably 600° C. Thereafter, at step 184, the deposition zone is maintained at process conditions suitable for depositing a silicon-containing dielectric film on the substrate. By use of these steps, a silicon nitride dielectric film, such as SiN, is deposited at a rate of approximately 50 angstroms/minute with a uniformity of 14%. The relatively high chamber pressure that may be achieved using BTBAS provides superior step coverage, while reducing the present of gaps in the dielectric film.

Figure 10:
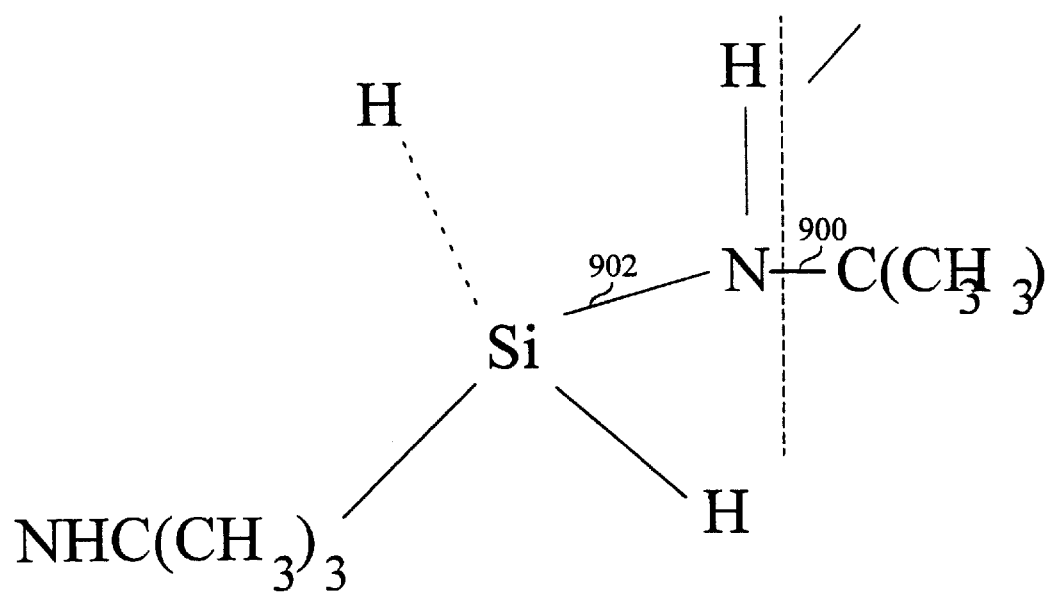
FIG. 10 is a plan view of the molecular structure of a precursor used in accordance with the present invention.

An additional advantage which is provided by employing BTBAS as a precursor for silicon nitride deposition, results from self-decomposition of the precursor. In this manner, BTBAS may be employed in a process gas that does not include additional nitrogen containing molecule, e.g. $N_2$ or $NH_3$. As seen in FIG. 10, the self-decomposition reaction mechanism results from the breaking of the nitrogen-carbon bond 900. This decouples the silicon-nitrogen bond 902 from the BTBAS molecule that facilitates formation of a silicon-nitride, SiN, film. The presence of the silicon-nitrogen bond 902 allows the BTBAS precursor to deposit silicon-nitride films using any reactant molecule independent of the presence of a nitrogen atom therein. In this fashion, the key factor in choosing a reactant molecule is the ability of the same to breaking the nitrogen-carbon bond 900, as well as removing hydrocarbon byproducts.

A reactant that includes an additional nitrogen source may alter the reaction path, and thus enhance the BTBAS reactivity. For example, use of molecular nitrogen, $N_2$, as a carrier gas to deliver BTBAS vapor may triple the deposition rate, compared to a helium, He, carrier gas. Depending on the by-product formation, the impurities inside the nitride film, such as H and C content, can be optimized to yield the best film quality.

Although BTBAS has been discussed with respect to formation of silicon oxide and silicon nitride films, it should be understood that BTBAS may be employed to form other types of dielectric films. The scope of the invention, therefore, should be determined not with reference to the above description, but should be determined with reference to the appended claims along with their full scope of equivalents.

What is claimed is:

1. A substrate processing system comprising:

a housing for forming a process chamber;

a substrate moving system for moving said substrate into said process chamber and positioning said substrate on said substrate holder;

a gas delivery system for introducing a process gas into said process chamber to deposit a layer over said substrate;

a temperature control system for maintaining a selected temperature of the substrate;

a pressure control system for maintaining a selected pressure within said process chamber;

a controller for controlling said gas delivery system, said temperature control system and said pressure control system; and a memory data communication with said controller containing a computer program, to be operated on by said controller, for practicing a process comprising the steps of:

flowing, into said process chamber, a process gas including bistertiarybutylaminesilane (BTBAS); and maintaining said deposition zone at process conditions suitable for depositing a silicon-containing dielectric layer on said substrate without chemical reaction between the BTBAS and another nitrogen source.

2. The substrate processing system of claim 1 wherein the process gas further includes an oxygen source.

3. The substrate processing system of claim 2 wherein the oxygen source includes molecular oxygen, $O_2$, or ozone, $O_3$.

4. The substrate processing system of claim 1 wherein the silicon-containing dielectric layer is deposited on the substrate by self-decomposition of the BTBAS involving breaking nitrogen-carbon bonds in the BTBAS.

5. The substrate processing system of claim 4 wherein the silicon-containing dielectric layer is deposited on the substrate by self-decomposition of the BTBAS involving decoupling silicon-nitrogen bonds in the BTBAS.

6. The substrate processing system of claim 1 wherein the computer program includes computer instructions for controlling the pressure control system to maintain a pressure level within the process chamber of no greater than 760 Torr.

7. The substrate processing system of claim 6 wherein the pressure level is no less than 1 Torr.

8. The substrate processing system of claim 6 wherein the pressure level is no greater than 625 Torr.

9. The substrate processing system of claim 1 wherein the dielectric layer is a silicon nitride layer or a silicon oxynitride layer.

10. The substrate processing system of claim 1 wherein the computer program includes computer instructions for controlling the temperature control system to maintain a temperature level of the substrate in the range of 500° to 650° C.

11. The substrate processing system of claim 1 wherein the process gas enters the process chamber at a point separated from said substrate by approximately 240 mils.

12. The substrate processing system of claim 1 wherein the computer program includes computer instructions for controlling the gas delivery system to provide two flows of gases, including a flow of an oxygen source and a flow of the BTBAS, with the flow of BTBAS entering the process chamber at a rate in the range of 400–1200 milligrams per minute (mgm).

13. The substrate processing system of claim 12 wherein the flow of the oxygen source enters the process chamber at a rate in the range of 1,000 to 3,000 sccm.

14. A substrate processing system comprising:

a housing for forming a process chamber;

a substrate moving system for moving said substrate into said process chamber and positioning said substrate on said substrate holder;

a gas delivery system for introducing a process gas into said process chamber to deposit a layer over said substrate;

a temperature control system for maintaining a selected temperature of the substrate;

a pressure control system for maintaining a selected pressure within said process chamber;

a controller for controlling said gas delivery system, said temperature control system and said pressure control system; and a memory data communication with said controller containing a computer program, to be operated on by said controller, for practicing a process comprising the steps of:

flowing, into said process chamber, a process gas including bistertiarybutylaminesilane (BTBAS); and maintaining said deposition zone at process conditions suitable for depositing a silicon nitride layer on said substrate by self-decomposition of the BTBAS.

15. The substrate processing system of claim 14 wherein the process gas includes a carrier gas comprising molecular nitrogen, $N_2$, or helium.

16. The substrate processing system of claim 14 wherein the silicon nitride layer is deposited on the substrate by self-decomposition of the BTBAS involving breaking nitrogen-carbon bonds in the BTBAS.

17. A substrate processing system comprising:

a housing for forming a process chamber;

a substrate moving system for moving said substrate into said process chamber and positioning said substrate on said substrate holder;

a gas delivery system for introducing a process gas into said process chamber to deposit a layer over said substrate;

a temperature control system for maintaining a selected temperature of the substrate;

a pressure control system for maintaining a selected pressure within said process chamber;

a controller for controlling said gas delivery system, said temperature control system and said pressure control system; and a memory data communication with said controller containing a computer program, to be operated on by said controller, for practicing a process comprising the steps of:

flowing, into said process chamber, a process gas including bistertiarybutylaminesilane (BTBAS), the process gas containing no additional nitrogen source therein; and maintaining said deposition zone at process conditions suitable for depositing a silicon-containing dielectric layer on said substrate by self-decomposition of the BTBAS.

18. The substrate processing system of claim 17 wherein the dielectric layer is a silicon nitride or silicon oxynitride layer.

19. The substrate processing system of claim 17 wherein the silicon-containing dielectric layer is deposited on the substrate by self-decomposition of the BTBAS involving breaking nitrogen-carbon bonds in the BTBAS.

* * * * *